(12) United States Patent
Takakamo et al.

(10) Patent No.: US 7,161,354 B2
(45) Date of Patent: *Jan. 9, 2007

(54) LEAKAGE CURRENT OR RESISTANCE MEASUREMENT METHOD, AND MONITORING APPARATUS AND MONITORING SYSTEM OF THE SAME

(75) Inventors: Naohiro Takakamo, Shibata (JP); Kuniyoshi Sakai, Niigata (JP); Yoshikazu Terakami, Yachiyo (JP)

(73) Assignee: Hitachi, Ltd., Tokyo (JP)

( * ) Notice: Subject to any disclaimer, the term of this patent is extended or adjusted under 35 U.S.C. 154(b) by 24 days.

This patent is subject to a terminal disclaimer.

(21) Appl. No.: 11/088,656

(22) Filed: Mar. 23, 2005

(65) Prior Publication Data

US 2005/0200364 A1    Sep. 15, 2005

Related U.S. Application Data

(62) Division of application No. 10/265,040, filed on Oct. 4, 2002.

(30) Foreign Application Priority Data

Oct. 4, 2001    (JP) ............................. 2001-308552
Sep. 19, 2002    (JP) ............................. 2002-272428

(51) Int. Cl.
  *G01R 31/08*    (2006.01)

(52) U.S. Cl. ..................................... 324/522; 324/525

(58) Field of Classification Search .................... None
See application file for complete search history.

(56) References Cited

U.S. PATENT DOCUMENTS

| | | | |
|---|---|---|---|
| 3,732,490 A | | 5/1973 | Botka |
| 6,072,708 A | | 6/2000 | Fischer |
| 6,327,124 B1 | | 12/2001 | Fearing et al. |
| 6,421,618 B1 | | 7/2002 | Kliman et al. |
| 6,593,751 B1 | | 7/2003 | Takahashi |
| 2005/0225909 A1* | | 10/2005 | Yoshizaki et al. ............ 361/42 |

FOREIGN PATENT DOCUMENTS

JP          2004184346 A  *   7/2004

* cited by examiner

*Primary Examiner*—Vincent Q. Nguyen
(74) *Attorney, Agent, or Firm*—Townsend and Townsend and Crew LLP

(57) ABSTRACT

A method for measuring the resistance component current included in the leakage current is provided. In a monitoring apparatus and system for measurement the signal waveform of at least one AC cycle is sampled. The resistance component leakage current is measured by dividing the average of integrated value of the instantaneous leakage current values and the instantaneous voltage values by the square root of average of squared instantaneous voltage values. In addition, a voltage signal of the target measurement circuit is obtained the waveform of the leakage current signal and the voltage signal for one cycle is sampled and stored; the leakage current signal and the voltage signal are expanded to N-th higher harmonic wave component respectively, and the resistance component that relates to the leakage current is calculated.

11 Claims, 11 Drawing Sheets

LEAKAGE CURRENT OR RESISTANCE MEASUREMENT METHOD, AND MONITORING APPARATUS AND MONITORING SYSTEM OF THE SAME

BACKGROUND OF THE INVENTION

This invention relates to a method for measuring the resistance component current included in a leakage current and resistance value, namely insulation resistance to monitor the insulation of a distribution system, and relates to an instrument, apparatus, or system to which this measurement method is applied.

(A) a direct measurement method in which a zero-phase current transformer is provided to a distribution circuit or a grounding conductor of a transformer, (B) a measurement method in which a voltage is applied externally on a grounding conductor of a transformer or a distribution circuit, or (C) a method in which a leakage current is measured based on the output of a zero-phase current transformer and the voltage of a distribution circuit have been proposed as the method for measurement of the leakage current or insulation resistance of a conventional distribution system.

The exemplary disclosure that belongs to (A) includes Japanese Patent Laid-Open No. H2-129556, the exemplary disclosure that belongs to (B) includes Japanese Patent Laid-Open No. S63-238470, Japanese Patent Laid-Open No. H1-143971, Japanese Patent Laid-Open No. H2-83461, Japanese Patent Laid-Open No. H4-52565, Japanese Patent Laid-Open No. H6-258363, Japanese Patent Laid-Open No. H9-318684, and Japanese Patent Laid-Open No. H1-304855, and the exemplary disclosure that belongs to (C) includes Japanese Patent Laid-Open No. H3-179271, Japanese Patent Laid-Open No. H4-220573, Japanese Patent Laid-Open No. H6-339218, Japanese Patent Laid-Open No. H2001-225247, and Japanese Patent Laid-Open No. H2001-21604.

These disclosures are summarized in FIG. 9.

FIG. 9 is a structural diagram showing a leakage current measurement system. In FIG. 9, 40 denotes a transformer, 41 denotes a breaker, 42 denotes a primary circuit of a distribution system, 43a, 43b, and 43c denote loads of electric components, 44 denotes a grounding conductor of the transformer 40, 45 denotes an apparatus for measurement of the leakage current based on the received output of a current transformer 46, 47a, 47b, and 47c denote electrostatic capacities generated on the distribution path, 48a, 48b, and 48c denote power switches of the loads 43a to 43c, and 49 denotes an electrostatic capacity of a noise filter provided to the load. 50 denotes a voltage application apparatus for applying a voltage on the ground conductor 44 of the transformer 40, and 51 denotes the insulation resistance of the load 43a or the insulation resistance of wiring of the primary circuit 42 for the purpose of convenience.

Iz denotes a leakage current of the primary circuit, Ic denotes a capacitative current (reactive component current) that flows in the electrostatic capacity, and Igr denotes a resistance component current (active component current) that flows in the insulation resistance component.

In FIG. 9, in the above-mentioned measurement method (A) the zero-phase current transformer is provided to the grounding conductor 44 of the transformer 40 to measure the leakage current. In the measurement method (B), a voltage of about 1 Hz/1 V is applied from the voltage application apparatus 50 so that a current does not flow to the electrostatic capacities 47a to 47c to eliminate the effect of the electrostatic capacity, and a signal generated from the zero-phase current transformer 46 is measured by use of the instrument 45. In the measurement method (C), the measurement is carried out based on the voltage applied from the primary circuit 42 of the distribution system and the output of the zero-phase current transformer 46.

FIG. 10 is a vector diagram showing the leakage current Iz, the capacitative that flows in the electrostatic capacity, and the resistance component current that flows in the insulation resistance component. In FIG. 10, the phase angle between the phase voltage and the line voltage is 30 degrees in the case of the three-phase alternating voltage. The capacitative current Ic is 90 degrees different from the resistance component current Igr, and the leakage current Iz is the composite current of the current Ic and the current Igr, namely vector sum. However, the capacitative current varies depending on the magnitude of the loading. For example, when all the loads 43a to 43c are loaded, the capacitative current increases as shown with Ic'. As the result, the leakage current Iz changes to Iz'. In other words, the currents Iz' and Ic' change depending on the variation of the load.

The above-mentioned method (A) is involved in a problem of incapable measurement of the resistance component current if the electrostatic capacity is large due to a noise filter because reactive component current is predominant.

The above-mentioned method (B) is also involved in a problem of complex system structure due to the requirement of external application of a voltage and the requirement of no effect on the loading apparatus.

One exemplary method of the above-mentioned method (C) is involved in a problem of unsuitability for a plurality of distribution circuits because an auxiliary impedance element is provided and the insulation resistance is determined.

Another exemplary method of the above-mentioned method (C), in which the phase angle is determined to calculate the resistance component current and resistance value and to further detect the insulation deterioration phase, is involved in the difficulty in determination of the correct phase angle in the small current region because of the characteristic of the current transformer.

SUMMARY OF THE INVENTION

It is one object of the present invention to obtain the highly reliable resistance component current value and the resistance value, namely the insulation resistance, to solve the above-mentioned problem of the conventional methods. It is the other object of the present invention to monitor the change of insulation deterioration with time for alarming, to enable to check and keep maintenance, and to prevent sudden failure.

To achieve the above-mentioned objects, the present invention provides the following methods.

(1) A method for measuring the resistance component current of a target measurement circuit from the signal of a current transformer for detecting the leakage current of the target measurement circuit and the voltage signal of the target measurement circuit, wherein the waveform signal of at least one cycle is sampled, and the resistance component current is obtained from the result of division of the average of the integrated value of the instantaneous voltage values and the instantaneous leakage current values by the square root of average of squared instantaneous voltage values.

(2) A method for measuring the resistance component current of a three-phase AC target measurement circuit from the signal of a current transformer for detecting the leakage current of the target measurement circuit and the voltage signal of the target measurement circuit, wherein the waveform signal of at least one cycle is sampled and the voltage signal is stored, and the resistance component current is obtained from the result of division of the average of integrated value of the instantaneous value of the leakage current and the instantaneous value of the stored voltage signal at the phase angle of 30 degrees advance by the square root of average of squared instantaneous values of the voltage signal.

(3) A method for measuring the resistance component current of a three-phase AC target measurement circuit from the signal of a current transformer for detecting the leakage current of the target measurement circuit and the voltage signal of the target measurement circuit, wherein the waveform signal of at least one cycle is sampled and the voltage signal is stored, and the resistance component current is obtained from the result of division of the average of integrated value of the instantaneous value of the leakage current and the instantaneous value of the stored voltage signal at the phase angle 30 degrees advance by the square root of average of squared instantaneous values of the voltage signal for the three-phases. Each phase voltage of the three-phases used for calculation of the leakage component current may be obtained by means of a method in which the line voltage signal of two phases is obtained and the residual one phase voltage is obtained by means of the vector arithmetic, or may be obtained by means of a method in which one line voltage signal is obtained, and the residual two phase voltage signals are obtained by retarding phase angle of the above-mentioned voltage signal by 120 degrees and 240 degrees respectively. Otherwise in the case that the voltage-to-ground is used, the residual one phase voltage may be obtained from the voltage-to-ground of two lines and the residual one phase voltage is obtained by means of the vector arithmetic, or may be obtained by means of a method in which the voltage-to-ground of one line is obtained, and the phase voltage of the residual two phases is obtained by retarding phase angle of the above-mentioned voltage signal by 120 degrees and 240 degrees respectively.

(4) The resistance component that relates to the leakage current is obtained by means of a method in which a leakage current signal of an AC current target measurement circuit, a voltage signal of the target measurement circuit, and the waveform of the leakage current signal and the voltage signal for one cycle are sampled and stored, the leakage current signal and the voltage signal are expanded to N-th higher harmonic wave component respectively, and the resistance component that relates to the leakage current is calculated according to the simultaneous equations based on the assumption that the value obtained by dividing the leakage current component of the second or higher order by the voltage component of the same order is regarded to be equal to the admittance composed of the resistance component of the same order and the electrostatic capacity component.

(5) The resistance component that relates to the leakage current is obtained by means of a method in which a leakage current signal of an AC current target measurement circuit, a voltage signal of the target measurement circuit, and the waveform of the leakage current signal and the voltage signal for one cycle are sampled and stored, the leakage current signal and the voltage signal are expanded to N-th higher harmonic wave component respectively, and the resistance component that relates to the leakage current is calculated as the result of the phase angle difference between the leakage current component of at least one order obtained from the expansion arithmetic and the voltage component of the same order.

(6) The resistance component that relates to the leakage current is obtained by means of a method in which a leakage current signal of an AC current target measurement circuit, a voltage signal of the target measurement circuit, and the waveform of the leakage current signal and the voltage signal for one cycle are sampled and stored, the leakage current signal and the voltage signal are expanded to the DC component and N-th higher harmonic wave component respectively, and the resistance component that relates to the leakage current is calculated by dividing the voltage signal DC component obtained from the expansion arithmetic by the leakage current signal DC component obtained in the same manner.

(7), The order to be selected in the above-mentioned (5) and (6) is a multiple of 3 that is suitable for the three-phase AC.

(8) The largest ratio to the basic wave component of N-th higher harmonic wave component of the order to be selected to calculate the resistance component that relates to the leakage current is selected automatically for measurement of the resistance component in the above-mentioned (5) and (6).

BRIEF DESCRIPTION OF THE DRAWINGS

FIG. 13 is a diagram showing an insulation monitoring apparatus contained in a distribution panel.

DETAILED DESCRIPTION OF THE PREFERRED EMBODIMENTS

Embodiments of the present invention will be described in detail hereinafter with reference to the drawings.

Figure 1:
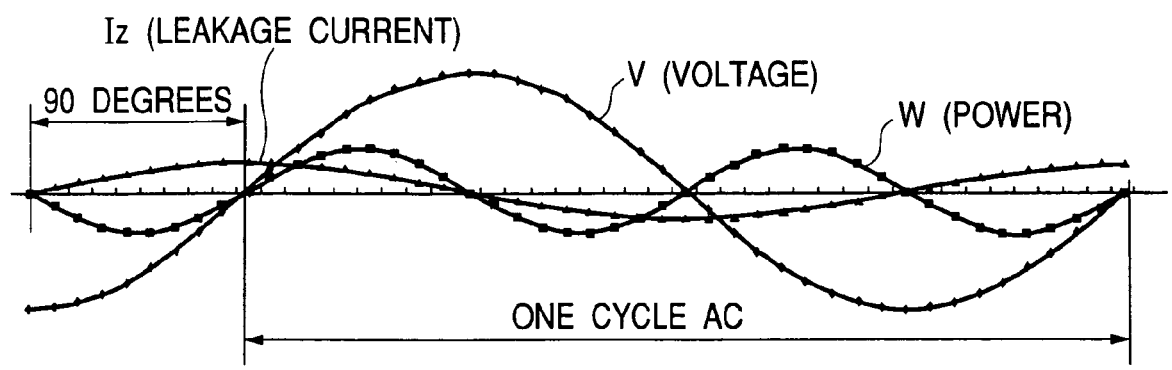
FIG. 1 is a waveform diagram for describing the first embodiment of the leakage current measurement method in accordance with the present invention.
Figure 9:
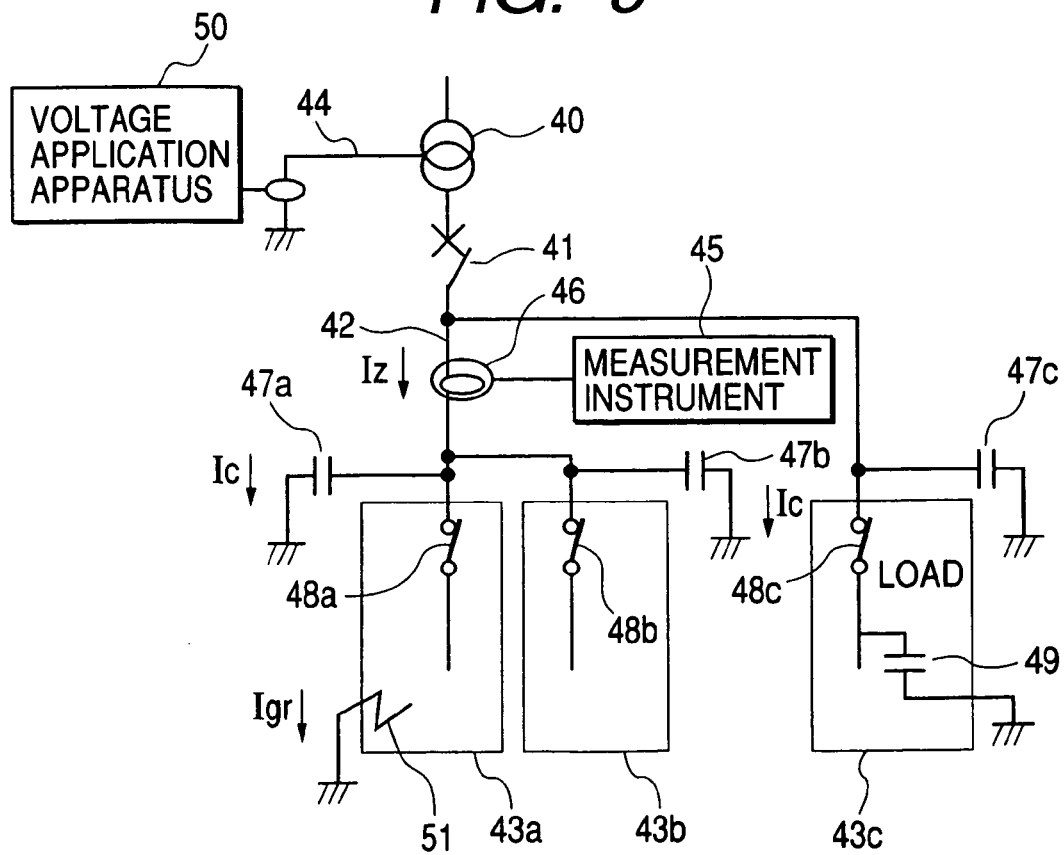
FIG. 9 is a structural diagram showing a leakage current measurement system.

FIG. 1 is a waveform diagram for describing the first embodiment of the leakage current measurement method in accordance with the present invention, and the principle of calculation of the resistance component current from the leakage current by use of this waveform diagram. The waveform shows a waveform for the case that the primary circuit 42 of the distribution system shown in FIG. 9 is a single-phase circuit, in which the output of the current transformer 46 and the voltage waveform generated from the primary circuit 42 are represented by the time axis.

In FIG. 1, Iz denotes the leakage current, V denotes the voltage, W denotes the leakage current power, and dots of each waveform show the sampling value. The phase of the leakage current Iz proceeds 90 degrees ahead of the voltage if no active component current Igr is involved.

The power W of the AC circuit is calculated by use of the equation W=VI cos Φ according to the AC theory, wherein V denotes the circuit voltage, I denotes the load current, and cos Φ denotes the phase angle (power factor angle) of the voltage and the load current. The instantaneous value of the voltage and current waveform for one AC cycle is sampled and the average integrated value of instantaneous voltage values and instantaneous load current values is calculated.

Figure 10:
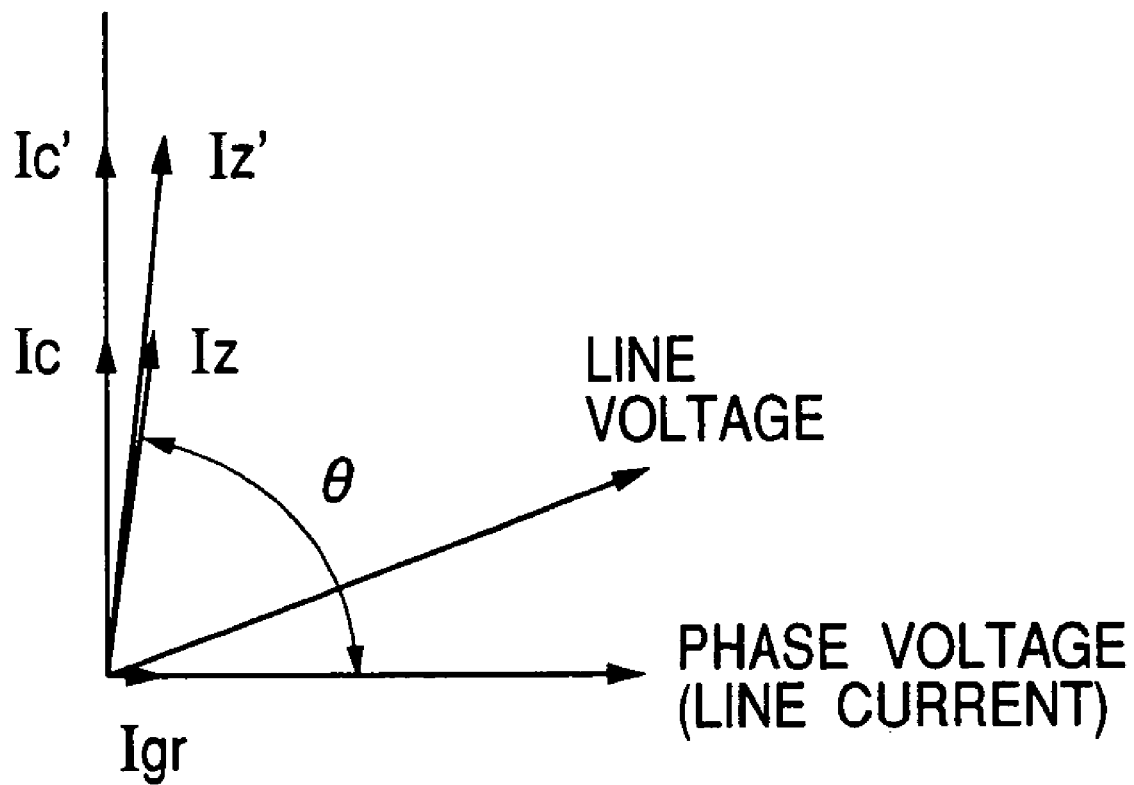
FIG. 10 is a vector diagram showing the vector of the leakage current Iz of the primary circuit, the capacitative current that flows in the electrostatic capacity, and the resistance component current that flows in the insulation resistance component.

As shown in FIG. 10, the active component current Igr is given by the equation Iz cos Φ, wherein the Iz denotes the leakage current. This embodiment is characterized in that the power which is replaced with the leakage current Iz instead of the load current I of the equation W=VI cos Φ (leakage current power) is calculated and the power is further divided by the voltage to obtain the active component current Igr.

In other words, W/V=Iz cos Φ=Igr. As the result, the resistance component current (active component current) Igr is obtained. Herein, the voltage means the voltage for one AC cycle, and the voltage is obtained as the square root of the averaged square of sampled instantaneous voltage values.

As obvious from the above-mentioned equation, the power W and the voltage V are used as a means for calculating the resistance component current Igr, and the taken-in voltage V may be arbitrary. It is understandable that if the resistance component current included in the leakage current increases in FIG. 1, it comes near to the voltage phase and the power comes to the positive side.

Next, the second embodiment of the present invention will be described with reference to FIG. 2.

Figure 2:
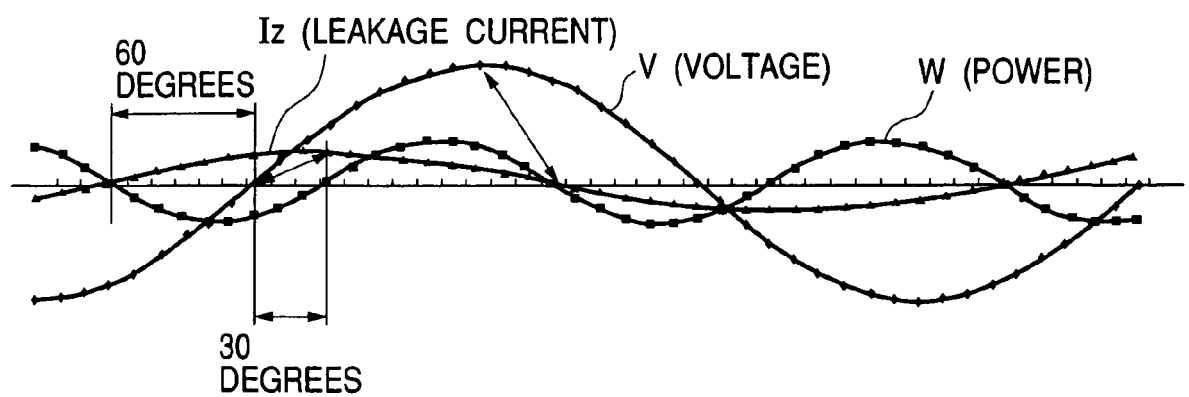
FIG. 2 is a waveform diagram for describing the second embodiment of the leakage current measurement method in accordance with the present invention.

FIG. 2 is a waveform diagram for describing the second embodiment of the leakage current measurement method in accordance with the present invention, and shows the voltage waveform, leakage current waveform, and leakage current power waveform for the case in which the power is supplied to the load with two-wire drawing from the first phase (RS) of the three-phase AC. In this case, the phase of the leakage current Iz proceeds 60 degrees ahead of the voltage (line voltage) if only the electrostatic capacity is involved. The reason is that the line voltage in the three-phase AC proceeds 30 degrees ahead of the phase voltage. Therefore, the second embodiment is characterized in that the instantaneous line voltage value is stored when the leakage current and the line voltage are sampled and the power calculated by use of the instantaneous leakage current value and the stored instantaneous voltage value that proceeds 30 degrees advance is obtained, and the power is divided by the voltage to calculate the resistance component current. Herein, the voltage is also the square root of average of squared instantaneous values of one AC cycle as in the case of the first embodiment.

Next, the third embodiment of the present invention will be described with reference to FIG. 3.

Figure 3:
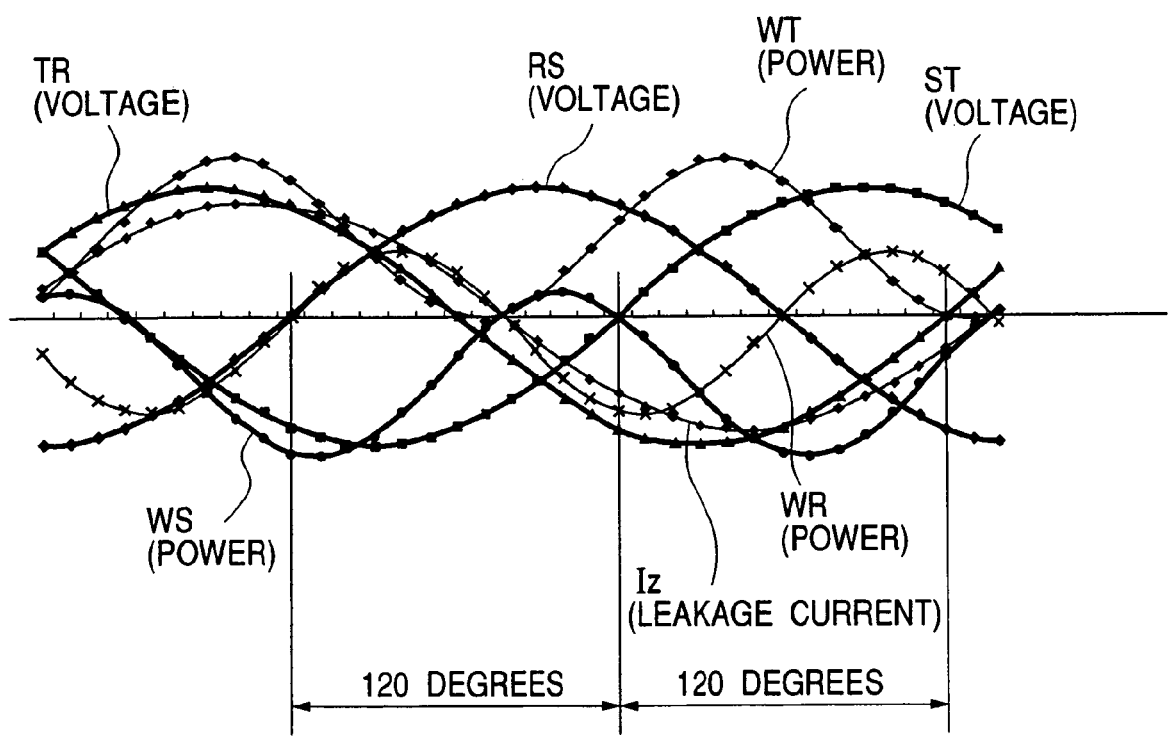
FIG. 3 is a waveform diagram for describing the first embodiment of the leakage current measurement method in accordance with the present invention.

FIG. 3 is a waveform diagram for describing the third embodiment of the leakage current measurement method in accordance with the present invention, and shows the voltage waveform of the three-phase AC (voltage RS, voltage ST, and voltage TR) and the leakage current waveform Iz of the three-phase AC. The voltage of the respective voltage waveforms of the three-phase AC is the line voltage. As it is well known, respective line voltages proceed with intervals of 120 degrees phase difference. When the leakage current is sampled correspondingly to each voltage waveform, the leakage current Iz proceeds 60 degrees ahead of the line voltage as shown in FIG. 3 in the case that only the electrostatic capacity is involved similarly to the second embodiment. Therefore, the instantaneous line voltage values are stored when the leakage current and instantaneous values of each line voltage waveform are sampled, each power is calculated by use of the instantaneous leakage current value and each stored instantaneous voltage value that proceeds 30 degrees advance, each power is divided by each voltage, the phase that has the positive maximum value among the resultant quotients corresponds to the insulation deterioration phase, and this value is regarded as the resistant component current value. Each phase voltage used when the resistance component current of each phase of the three-phase is calculated may be obtained by means of a method in which line voltage signals of two phases are obtained and the residual one phase is obtained by the vector arithmetic, or may be obtained by means of a method in which one line voltage signal is obtained and residual two phases are obtained from the voltage signal obtained as described hereinabove by retarding the phase angle by 120 degrees and 240 degrees. In the case that the voltage-to-ground is used, the residual one phase may be obtained by the vector arithmetic by use of the voltage-to-ground of the two lines, or may be obtained by means of a method in which the voltage-to-ground of one line is obtained and residual two phases are obtained by retarding the phase angle by 120 degrees and 240 degrees from the voltage signal obtained as described hereinabove.

Next, the sampling will be described herein under. The sampling means measurement of the waveform for one AC cycle at a predetermined time intervals, and the predetermined time interval means, for example, 0.5556 ms for 50 Hz that is a value obtained by dividing by 36, or 0.463 ms for 60 Hz that is a value obtained by dividing by 36.

Next, the fourth embodiment of the present invention will be described herein under.

According to the above-mentioned embodiments, the input voltage may be arbitrary. The voltage supplied from a target measurement circuit may be converted to an input voltage value, and the voltage value is divided by the resistance component current obtained in the first embodiment to the third embodiment to thereby calculate the resistance value. In other words, the insulation resistance value of the target measurement circuit is obtained.

Next, the fifth embodiment of the present invention will be described with reference to the equations 1 to 7.

The above-mentioned third embodiment is not suitable for the case in which the electrostatic-capacity components of respective phases are not balanced. However, the fifth embodiment is suitable for proper calculation even though the electrostatic capacity components of respective phases are not balanced.

$$y(t) = A_0 + \Sigma a_n \sin n\omega t + \Sigma b_n \cos n\omega t$$

or $$y(t) = A_0 + \Sigma A_n \sin(n\omega t + \phi n) \quad \text{(Equation 1)}$$

where $$A_n = \sqrt{a_n^2 + b_n^2}, \quad \phi n = \tan^{-1}(b_n/a_n)$$

$$a_n = 2/T \int y \cdot \sin n\omega t \, dt \quad b_n = 2/T \int y \cdot \cos n\omega t \, dt$$

The equations 1 to 7 are used for describing the fifth embodiment in accordance with the measurement method of the present invention for measurement of the resistance component of the leakage current. The equation 1 represents AC wave that is not a sine wave, namely expansion of a strained wave, which is well known equation as Fourier expansion. In the equation 1, y(t) represents a strained AC voltage or current, $A_0$ represents a DC component, $A_n \sin(n\omega t + \phi n)$ represents a basic component (n=1) and higher harmonic wave components.

$$V = V_0 + V_1 \sin(\omega t + \phi 1) + \quad \text{(Equation 2)}$$
$$V_2 \sin(2\omega t + \phi 2) + V_3 \sin(3\omega t + \phi 3) + \ldots$$

$$Iz = I_{Z0} + I_{Z1} \sin(\omega t + \phi 1) + \quad \text{(Equation 3)}$$
$$I_{Z2} \sin(2\omega t + \phi 2) + I_{Z3} \sin(3\omega t + \phi 3) + \ldots$$

The equations 2 and 3 are expansion of the voltage signal and leakage signal derived from the above-mentioned equation 1. The magnitude of the left side member y(t) may be replaced with the effective value obtained as a square root of squared instantaneous values, wherein the instantaneous voltage waveform signal or leakage current signal is sampled as in the embodiments 1 to 3.

$$Y_3 = V_3/I_{Z3} \quad \text{(Equation 4)}$$

$$Y_9 = V_9/I_{Z9} \quad \text{(Equation 5)}$$

$$Y_3 = \sqrt{(1/R)^2 + (3\omega C)^2} \quad \text{(Equation 6)}$$

$$Y_9 = \sqrt{(1/R)^2 + (9\omega C)^2} \quad \text{(Equation 7)}$$

The equation 4 and the equation 5 represent the admittance of, for example, third order higher harmonic wave component and ninth order higher harmonic wave component of a parallel circuit of a resistance component and electrostatic capacity component formed in the distribution circuit. The magnitude of the equation 4 and the equation 5 is represented by the equation 6 and the equation 7 respectively, wherein R denotes the resistance component, C denotes the electrostatic capacity component, and $\omega$ denotes the angular velocity $2\Pi f$. Therefore, the voltage and current are expanded into the third order higher harmonic wave component and the ninth order higher harmonic wave component by use of the equation 2 and the equation 3, the admittance of the third order higher harmonic wave component and the ninth order higher harmonic wave component is calculated by use of the equation 4 and the equation 5, and the simultaneous equation of the equation 6 and the equation 7 is solved to thereby obtain the resistance component R of the leakage current. The equation 4 and the equation 5 are represented by the admittance, however as a matter of course the value obtained by dividing the second or higher order voltage higher harmonic wave component by the current component of the same order is equal to the impedance comprising the resistance component and the electrostatic capacity component of the same order.

Next, the sixth embodiment of the present invention will be described with reference to the equation 1 to the equation 10.

$$\phi vi = \tan^{-1} V b_3/V a_3 - \tan^{-1} I b_3/I a_3 \quad \text{(Equation 8)}$$

$\phi vi$: Phase difference between third order higher harmonic wave voltage and current $$W_3 = I_{Z3} \cdot V_3 \cos \phi vi \quad \text{(Equation 9)}$$

$$R = V_3^2/W_3 \quad \text{(Equation 10)}$$

The equations 8 to 10 are used for describing the sixth embodiment in accordance with the measurement method of the present invention for measurement of the resistance component due to the leakage current. The equation 8 is used to calculate the phase angle difference between the voltage phase and the current phase based on the voltage phase as the reference for $\phi n$ in the above-mentioned equation 1. For example, the above-mentioned phase angle difference is the difference between the phase angle of the voltage and the current of the third order higher harmonic wave component calculated based on the equation 2 and the equation 3. The equation 9 is used to calculate the power of the third order higher harmonic wave component from the phase angle difference calculated by use of the above-mentioned equation 8 and, for example, the voltage and current of the third order higher harmonic wave component calculated by use of the above-mentioned equation 2 and the equation 3. The equation 10 is used to calculate the resistance component due to the leakage current from the above-mentioned equation 9 and the equation 2. The resistance component is calculated by use of the third order higher harmonic wave component in the present embodiment, however as a matter of course the resistance component can be calculated by use of other higher harmonic wave components.

Next, the seventh embodiment of the present invention will be described herein under.

The first term of the right side members that is the DC current component $A_0$ of the above-mentioned equation 1 is pertinent to a case in which the average of both positive and negative waves in one AC cycle is not equal to 0. The case does not happen in an AC circuit excepting rushing of load, however, insulation deterioration in a circuit causes the average value that is not equal to 0 and causes the direct current component. Therefore, the same method as used in the sixth embodiment in which the DC component of the voltage is divided by the DC component of the leakage current may be applied to calculate the resistance component due to the leakage current by use of the higher harmonic wave component.

Next, the eighth embodiment of the present invention will be described.

The third order higher harmonic wave component and the ninth order higher harmonic wave component are used in the fifth embodiment, and the third order higher harmonic wave component is used in the sixth embodiment exemplarily. However, it is not required to carry out storing and calculation on each phase as done in the third embodiment because the phase deviation between respective phases is 120 degrees in the case of the three-phase AC and the higher harmonic wave components of each phase of the orders of multiple of 3 appear at the same position additionally. Therefore, as a matter of course the calculation is carried out on one phase and division by the order component is carried out to calculate the resistance component due to the leakage current.

Next, the ninth embodiment of the present invention will be described herein under.

The wave is expanded to N-th order higher harmonic wave component, for example, the third or ninth order higher harmonic wave component in the fifth embodiment, and the wave is expanded to the third order higher harmonic wave component in the sixth embodiment to calculate the resistance component due to the leakage current. However, if the small value is obtained by expansion, the order limitation can result in poor reliability. To avoid such problem, the order having the larger proportion to the basic wave component is automatically selected from among the expanded N-th order higher harmonic wave components for calculation in the ninth embodiment.

Next, the tenth embodiment of the present invention will be described herein under.

The wave is expanded to, for example, the third or ninth order higher harmonic wave component in the fifth embodiment and the wave is expanded to the third order higher harmonic wave component in the sixth embodiment to calculate the resistance component due to the leakage current. However, the small higher harmonic wave component can result in poor reliability of the value obtained by expansion. To avoid such problem, the resistance component due to the leakage current is calculated by means of the method of the fifth embodiment or the sixth embodiment if the proportion to the basic wave component of the higher harmonic wave component is equal to or larger than a predetermined value, and on the other hand the resistance component due to the leakage current is calculated by means of any one method of the first embodiment to the fourth embodiment if the proportion to the basic wave component of the higher harmonic wave component is smaller than the predetermined value. The calculation method is selected automatically. This embodiment is suitable for, for example, the extremely small voltage higher harmonic wave.

Next, the eleventh embodiment of the present invention will be described herein under.

The DC current component is used to calculate the resistance component due to the leakage current in the seventh embodiment in the seventh embodiment. However, the reliability of the value obtained by calculation can be poor if the DC current component is extremely small. To avoid such problem, the resistance component due to the leakage current is calculated by means of the method of the seventh embodiment if the proportion to the basic wave component of the DC current component is equal to or larger than a predetermined value, and on the other hand the resistance component due to the leakage current is calculated by means of the method of the fourth embodiment if the proportion to the basic wave component of the DC current component is smaller than the predetermined value in the eleventh embodiment. This embodiment is suitable for, for example, the extremely small voltage higher harmonic wave.

Next, the twelfth embodiment of the present invention will be described by use of the equation 11.

$$Igr = V_3/R \quad \text{(Equation 11)}$$

The equation 11 involves a method in which the voltage waveform signal is sampled for one AC cycle and the square root of squared instantaneous values, namely the effective value of the voltage signal, is divided by the resistance component obtained in the fifth embodiment to the eleventh embodiment to thereby calculate the resistance component due to the leakage current.

Next, the thirteenth embodiment of the present invention will be described herein under.

The above-mentioned leakage current Iz of the primary circuit includes the capacitative current Ic that flows to the electrostatic capacity component and the resistance component current Igr that flows to the insulation resistance component, and circulates to the grounding conductor of the transformer 40 through the ground. The current causes a voltage between the primary circuit and the ground. Therefore, the resistance component current or resistance value can be calculated by obtaining the voltage-to-ground between one phase line of the target measurement circuit and the ground based on the voltage signal taken in the above-mentioned embodiments. If the voltage-to-ground is used, the voltage-to-ground of the residual one phase may be calculated by means of the vector arithmetic based on the voltage-to-ground of two lines, or may be calculated by means of a method in which the voltage-to-ground of one line is obtained and the voltage-to-ground of the residual two phases is obtained by retarding the phase angle by 120 degrees and 240 degrees from the voltage signal obtained as described hereinabove.

Next, the fourteenth embodiment of the present invention will be described herein under.

Figure 4:
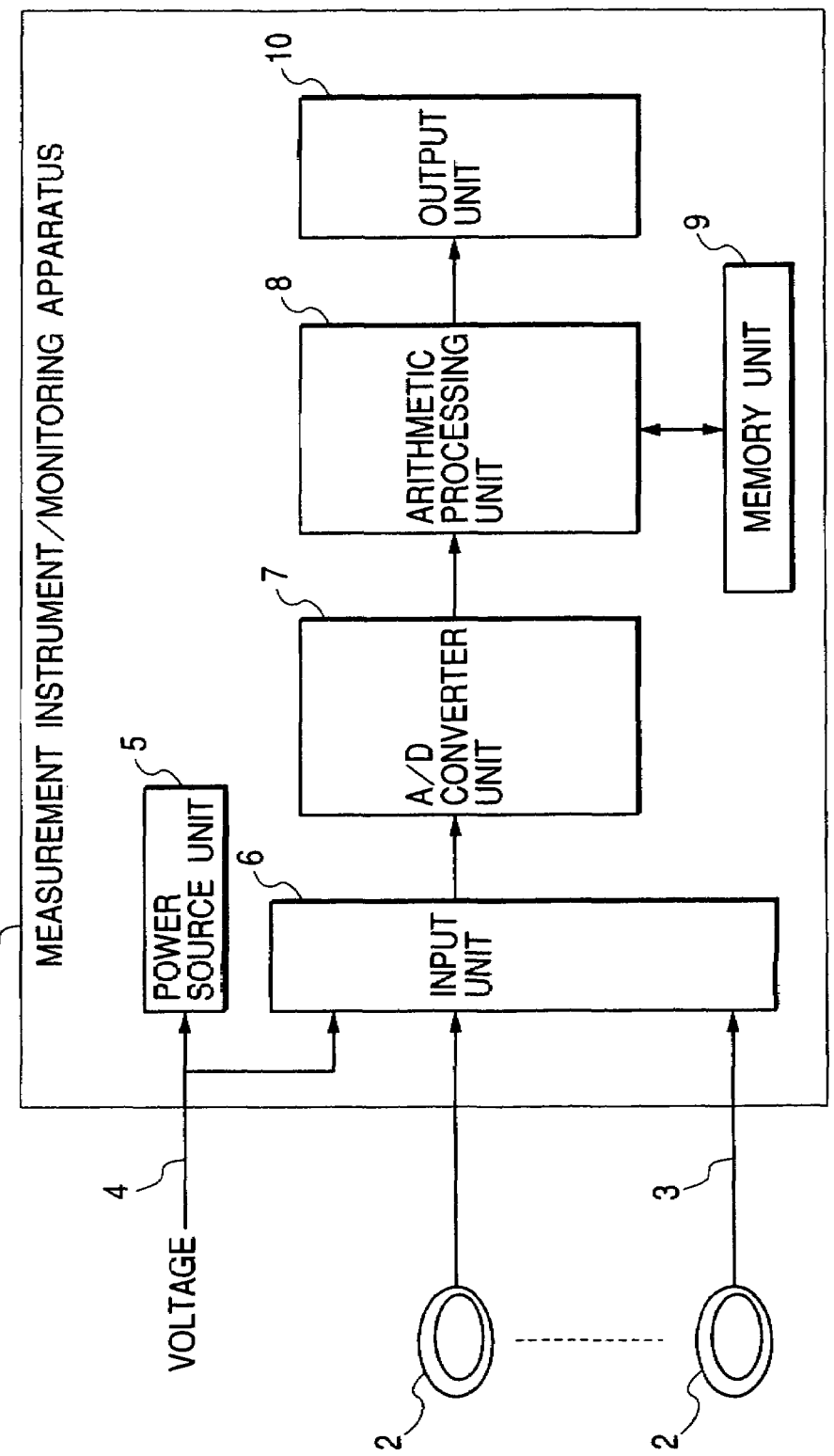
FIG. 4 is a structural diagram showing an embodiment of a leakage current measurement system that uses an instrument in accordance with the present invention.

FIG. 4 is a structural diagram showing an exemplary leakage current measurement system that uses a measurement instrument in accordance with the present invention. In FIG. 4, 1 denotes a measurement instrument, which is used also as a monitoring apparatus. The measurement instrument or monitoring apparatus 1 is provided with following components. 2 denotes a non-contact type current detector for measurement of the leakage current of a target measurement circuit, 3 denotes a signal line of the current detector, 4 denotes a voltage supply line, which is served also as a signal line, for supplying a suitable voltage to a power source unit 5 that supplies a voltage to the inside of the measurement instrument or monitoring apparatus 1, 6 denotes a input unit for converting the output received from the signal lines 3 and 4 to the suitable internal signal, 7 denotes an A/D converter unit for sampling and converting the output of the input unit 6 to the digital value in response to the command received from the arithmetic processing unit 8 that will be described hereinafter, and 8 denotes the arithmetic processing unit that is served for commanding the A/D converter unit 7 to sample a signal and convert it to a digital value, for commanding a memory unit 9 to store the obtained digital value therein, and for calculating the resistance component current and the resistance value by means of any one of the methods described in the first embodiment 1 to the thirteenth embodiment. Furthermore, the arithmetic processing unit 8 also supplies the resistance component current value that is obtained as the result of calculation to an output unit 10. The output unit 10 visually displays the calculation result obtained by means of the arithmetic processing unit 8 by use of a display apparatus or transmits the calculation result to remote sites.

In this embodiment, the voltage V supplied from the signal line (the circuit voltage is a single phase or single-phase three-lines, or two line drawing from three-phase three-lines) or the voltage RS and the leakage current Iz obtained from the leakage current detector 2, namely the vector sum of the capacitative current Ic and the resistance component current Igr, is supplied, the vector sum is converted to a digital value by means of the A/D converter unit 7, the converted vector sum is subjected to arithmetic by means of the arithmetic processing unit 8, and the resistance component current (active component current) or the resistance value of the insulation resistance is calculated. As the result, the resistance component current and the resistance value are obtained by means of the method described in the first to thirteenth embodiments.

Next, the fifteenth embodiment of the present invention will be described with reference to FIG. 5.

Figure 5:
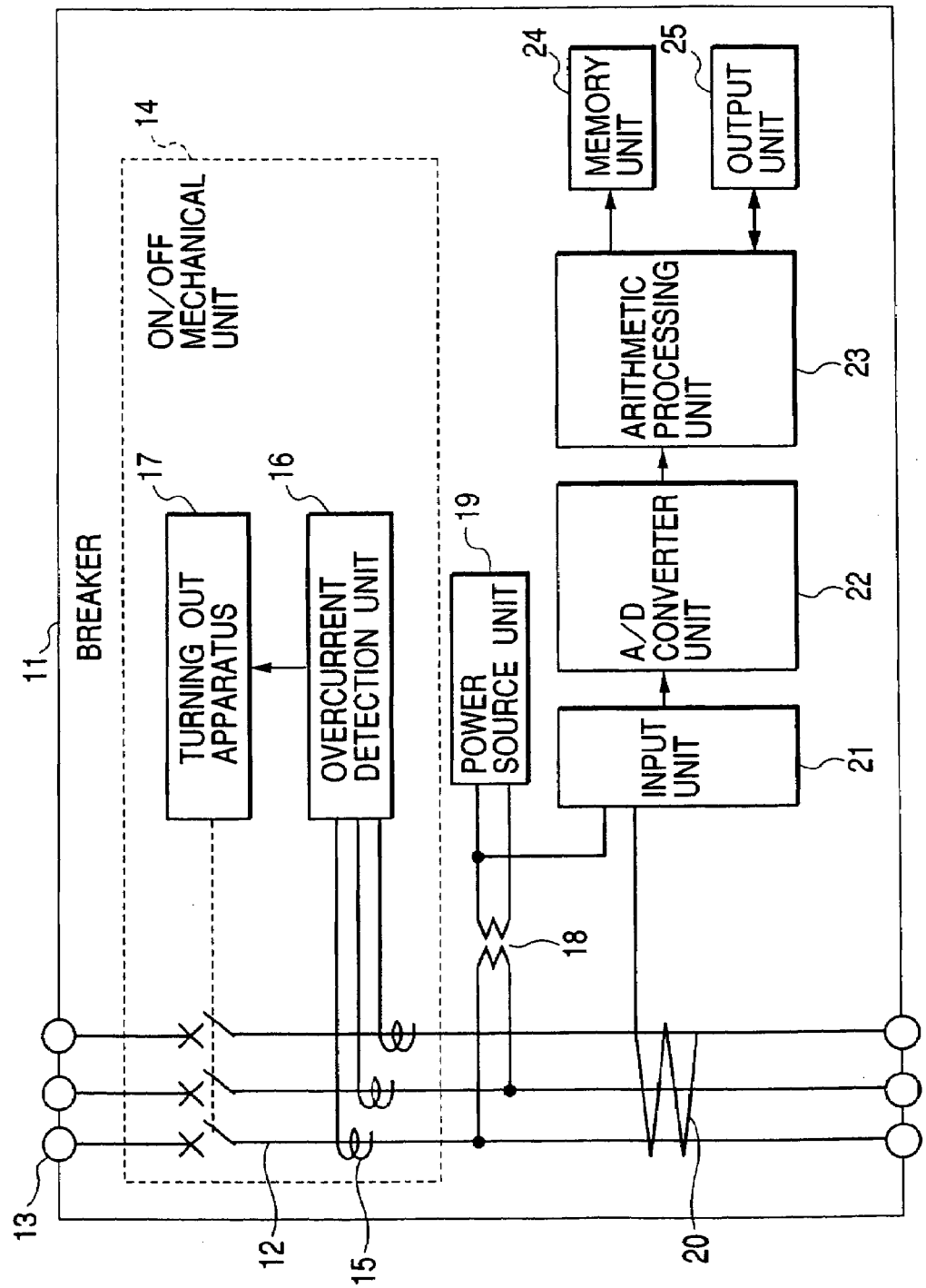
FIG. 5 is a structural diagram showing an embodiment of a leakage current measurement system that uses a circuit breaker in accordance with the present invention.

FIG. 5 is a structural diagram showing an exemplary leakage current measurement system that uses a circuit breaker in accordance with the present invention. The circuit breaker 11 comprises an off/on mechanical unit 14 and a leakage measurement unit. In the on/off mechanical unit 14, 12 denotes a cable way that connects the receiving end of the transformer 40 side to the supply end terminal of the load 43 side, and the cable way is opened/closed by means of the on/off mechanical unit 14. Furthermore, the on/off mechanical unit 14 comprises a breaker unit 27, a current transformer 15 for detecting a current, an overcurrent detection unit 16 for detecting overcurrent in response to a signal supplied from the current transformer 15 for detecting a current, and a turning out apparatus 17 for shutting down the breaker unit 27.

In the measurement unit, 20 denotes a non-contact type current detector for measurement of the leakage current of the cable way, 18 denotes a built-in step-down transformer of the breaker 11, 19 denotes a power source unit for supplying a suitable voltage to the inside, 21 denotes an input unit for receiving the output of the current detector 20 and the transformer 18 and for converting it to a suitable internal signal, 22 denotes an A/D converter unit for sampling the output of the input unit 21 and for converting the output to a digital value when a command of the arithmetic processing unit 23 described next is received. 23 denotes the arithmetic processing unit that supplies a sampling command and digital conversion command to the A/D converter unit 22, stores the obtained digital value in the memory unit 24, and calculates the resistance component current and the resistance value by means of any one of the methods described in the first embodiment to the twelfth embodiment. Furthermore, the arithmetic processing unit 23 supplies the resistance component current value that is the calculation result to an output unit 25, which will be described hereinafter. The output unit 25 visually displays the calculation result obtained by means of the arithmetic processing unit 23 on a display apparatus, or transmits the calculation result to remote sites. For example, a display apparatus having six digit segment display apparatus comprising an aggregate of light emitting diodes (LED element) or a power-saving liquid crystal type display apparatus may be used as the visual display apparatus for displaying the leakage current value and the resistance value.

Otherwise, as the remote transmission, the transmission method based on RS-232C and RS-485 standard that is American Industrial Association (EIA) Standard or the wireless transmission that uses radio wave or infrared ray may be used.

In the above-mentioned structure, the voltage V (the circuit voltage is a single phase or single-phase three-lines, or two line drawing from three-phase three-lines) or the voltage RS and the leakage current Iz are supplied to the input unit 21, and subjected to arithmetic by means of the arithmetic processing unit 23. As the result, the current value of the resistance component current and the resistance value are obtained. As described hereinabove, the resistance component current and the resistance value are obtained by means of the above-mentioned structure and any one of the methods described in the first embodiment to the twelfth embodiment.

Next, the sixteenth and seventeenth embodiments of the present invention will be described herein under with reference to FIG. 6 and FIG. 7.

Figure 6:
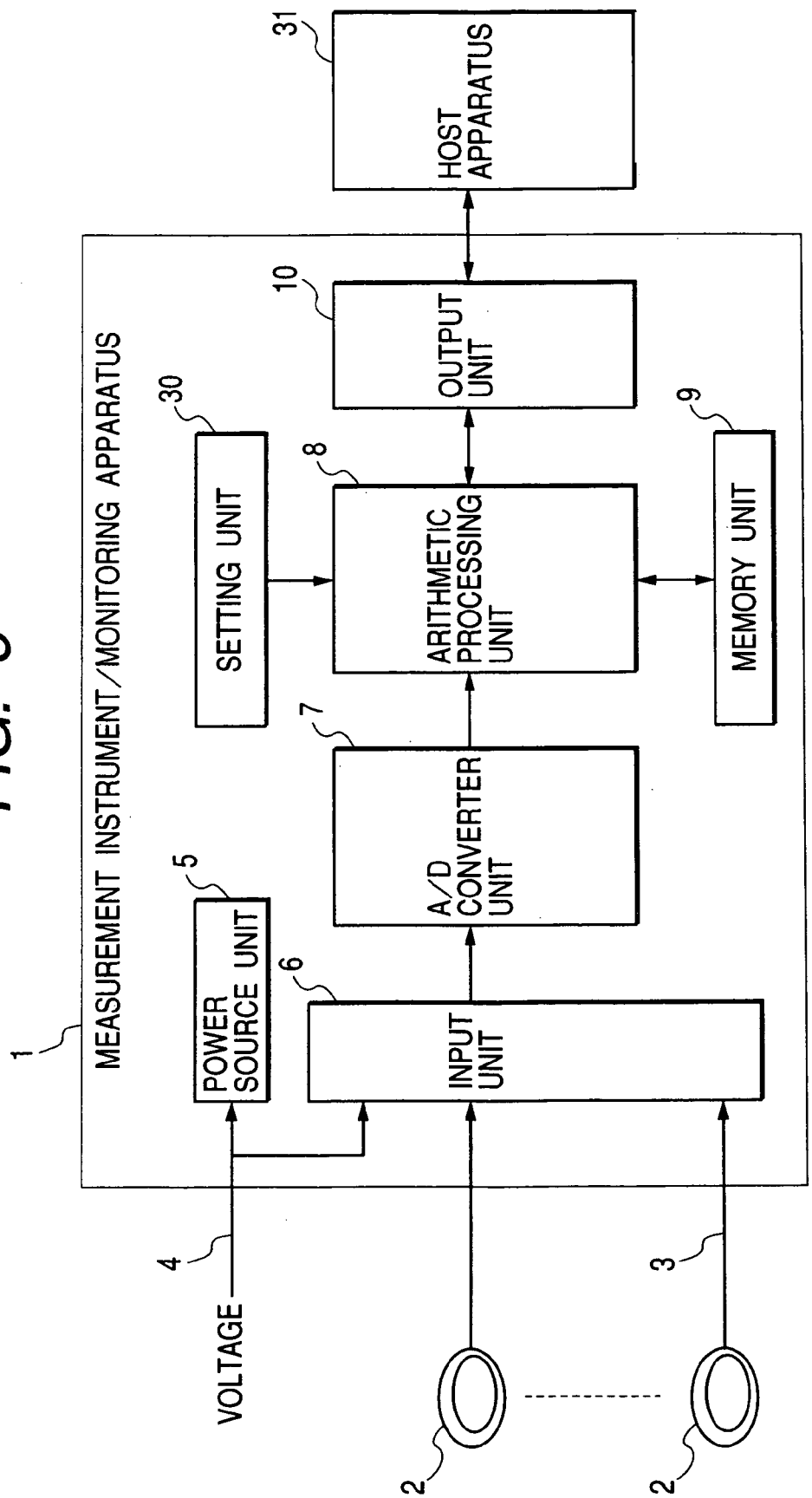
FIG. 6 is a structural diagram showing an embodiment of a leakage current measurement system that uses a monitoring apparatus in accordance with the present invention.

FIG. 6 is a structural diagram showing another embodiment of a leakage current measurement system that uses a monitoring apparatus in accordance with the present invention. FIG. 6 shows a system comprising a measurement instrument or monitoring apparatus and a host apparatus, the structure of the measurement instrument or monitoring apparatus is the same as that shown in FIG. 4. The same components as shown in FIG. 4 are given the same characters, and the description is omitted.

Figure 7:
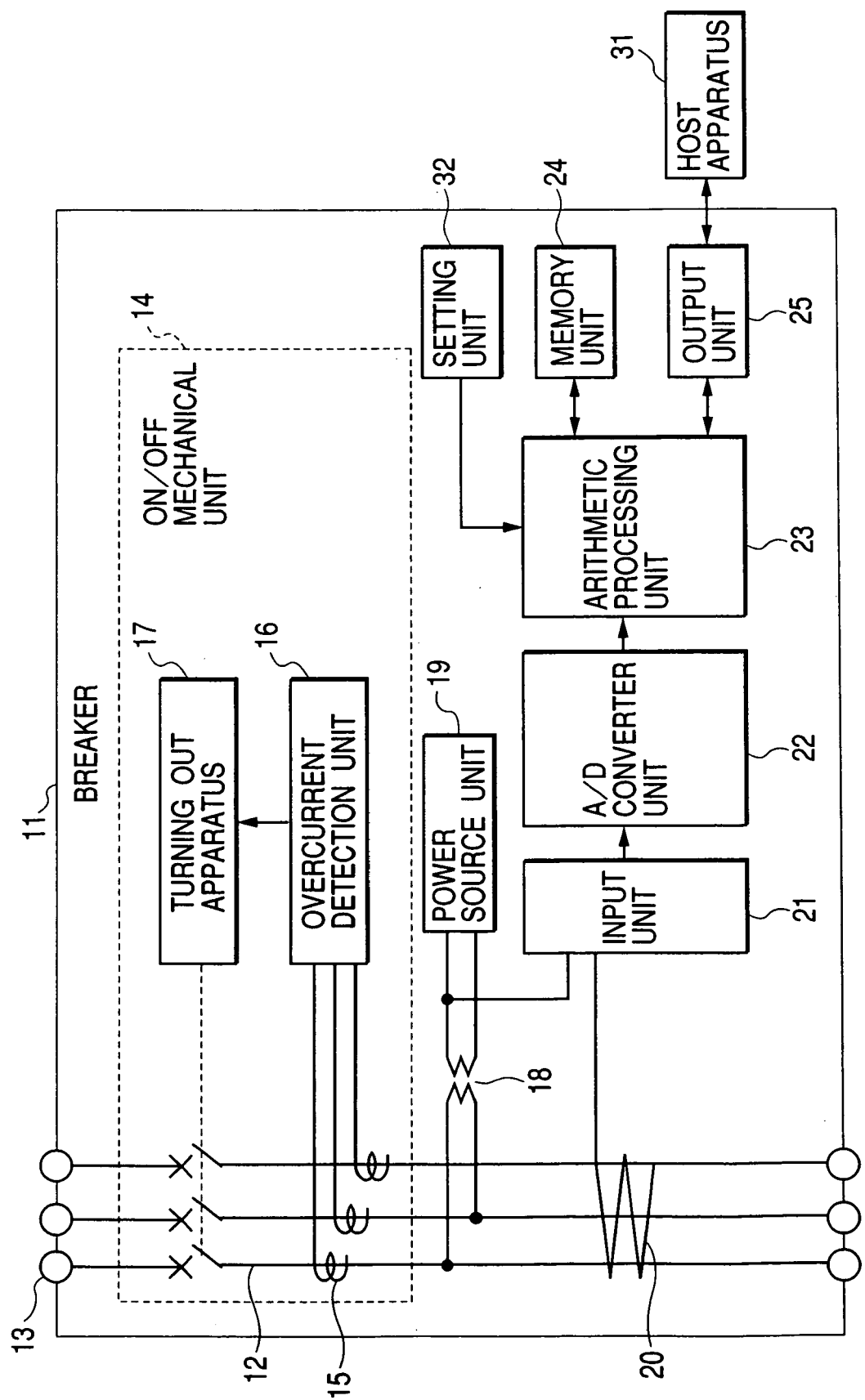
FIG. 7 is a structural diagram showing an embodiment of a leakage current measurement system that uses a breaker in accordance with the present invention.

FIG. 7 is a structural diagram showing another embodiment of a leakage current measurement system that uses a breaker in accordance with the present invention. The structure of the breaker 11 is the same as that shown in FIG. 5. The same components as shown in FIG. 5 are given the same characters, and the description is omitted.

Herein, the host apparatus 31 is, for example, a personal computer, and an output unit 10 and a communication means connect the host apparatus 31 to the above-mentioned measurement instrument or monitoring apparatus (terminal apparatus) 1 or the breaker 11. The output unit 10 is the same as the above-mentioned output unit 25. Furthermore, the host apparatus 31 stores or displays the information obtained from the terminal apparatus 1 or the breaker 11. The information means the resistance component current and the resistance value. Therefore, the host apparatus 31 also displays the change of the resistance component current value and the resistance value with time graphically.

In the above-mentioned description, the system having a single measurement instrument or monitoring apparatus and breaker 11 is described, however, a plurality of terminal apparatus 1 or breakers may be used without problem. The above-mentioned system may be a system having terminal apparatus such as measurement instrument, monitoring apparatus, and breakers combinedly.

Next, the eighteenth and nineteenth embodiments are described with reference to FIG. 6 and FIG. 7.

FIG. 6 shows a measurement instrument or monitoring apparatus 1 having a setting unit 30, and FIG. 7 shows a breaker 11 having a setting unit 32. The setting units 30 and 32 are served to set a value such as alarming level value. The set value is compared with a measured value, and if the measured value exceeds the set value, an alarm is generated. For example, the measure resistance component current is compared with an alarming level in the first to third embodiments or the fifth to thirteenth embodiments. For example, a built-in relay contact of the output unit 25 is closed to thereby generate an alarm sound, display an alarm image, or transmit an alarm signal to remote sites through communication line.

Next, the twentieth embodiment will be described. The content of the output supplied to the relay contact in the eighteenth and nineteenth embodiments remains as it was. For example, in the case that the relay is turned on due to the resistance component current value that exceeds the set value, the relay is remaining in ON-state until an ascertainment key of the setting unit 30 or 32 is operated. This system is useful to find out the cause of the trouble after an alarm is generated as the result of comparison with the alarming level, and the trouble is restored. Therefore, it is easy to find out the cause of the trouble.

Next, twenty-first embodiment will be described.

The setting units 30 and 32 are served to set a set value that is a value for comparison as described in the eighteenth and nineteenth embodiments, and the setting is operated by means of the host apparatus 31 having a communication means. Thereby, such system allows the staff not to go to the setting site for setting work because the setting unit can be set by remote communication, and the setting work can be done efficiently.

Next, the twenty-second embodiment will be described with reference to FIG. 8.

Figure 8:
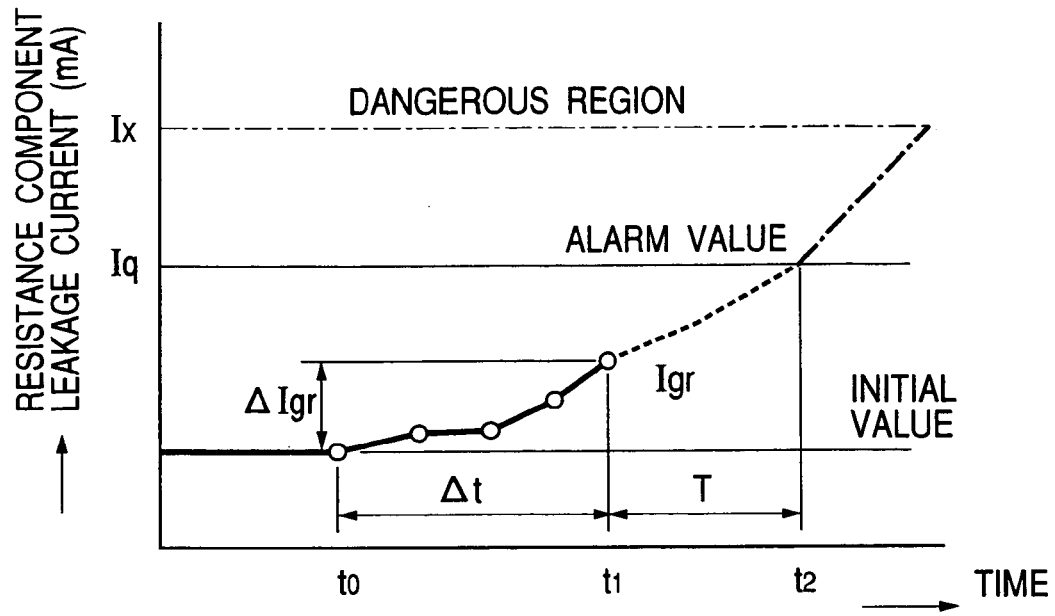
FIG. 8 is a characteristic diagram showing the resistance component current value change with time.

FIG. 8 is a characteristic diagram showing the change of the resistance current value with time. The abscissa represents the time, and the ordinate represents the resistance component current value (mA). It is the object of the present invention to measure the resistance component current included in the leakage current or the resistance value so as to determine the insulation deterioration state. Generally, insulation deterioration proceeds very slowly over a long time not within a short time. Therefore, if the time of reaching to the predetermined alarm level (alarm value) is predicted, the power supply interruption can be planned previously for replacing the deteriorated insulation parts, and the sudden failure can be prevented.

It is possible to predict the deterioration by monitoring a graph that shows the change of the resistance component current value with time until now and to predict the change of the resistance component current that will be after a predetermined time.

In FIG. 8, it is assumed that the resistance component current value begins to increase at the time t0 and increases by ΔIgr at the time t1, and the alarm value of the resistance component current value Igr is Iq. it is possible to predict that the resistance component current value will reach to Iq around t2 based on the resistance component change during the time t0 to t1.

The resistance component current is not necessarily stable and involved in dispersion problem to cause difficulty in the prediction. However, the resistance component current is preferably predicted by means of the method of least squares that is the demand monitoring technique of the distribution system, which is disclosed in Japanese Patent Laid-Open No. 2000-014003 applied by the inventors of the present invention. This method is served to predict the power consumption that will be after residual time T. On the other hand in this embodiment, a set value (alarm value) Iq of the resistance component current value Igr that is set previously is set instead of the power (Q), and the residual time (T) is determined reversely. In detail, the resistance component current ΔIgr is measured and stored at a plurality of time points between the current time point t1 and the time point before Δt shown in FIG. 8, and the time period T during which the resistance component current reaches to the set value (alarm value) Q point is predicted.

The leakage current Ix that is in a dangerous region is predicted by employing this method, and the time period during which the leakage current reaches to Ix is predicted.

The time period during which the resistance component leakage current reaches to the alarm level (alarm value) is predicted by means of the above-mentioned method. In the above, the set value is a resistance component current, but it is apparent that the set value may be a resistance value.

Next, the twenty-third embodiment will be described.

In the eighteenth and nineteenth embodiments, the alarm signal is one-way communicated from the measurement instrument, monitoring apparatus 1, or breaker 11 to the host apparatus 31. However, two-way communication may be preferably employed for easy mutual communication. In detail, the host apparatus 31 requests the information to a plurality of terminal apparatus of the monitoring apparatus successively as required, and the terminal apparatus transmit the information to the host apparatus 31 in response to the request. As the result, collision of communication signals is prevented.

Next, the twenty-fourth embodiment will be described.

The communication employed in the eighteenth and nineteenth embodiments is wire communication generally. However, a lot of laying work is required for the wire communication. To avoid such laying work, the radio communication, namely wireless communication, is employed in this embodiment. According to this method, the laying work is reduced significantly.

Next, the twenty-fifth embodiment will be described.

The memory units 9 and 24 are used in the fourteenth embodiment to the nineteenth embodiment shown in FIG. 4 to FIG. 7 to store the sampled voltage value mainly. In this embodiment, the resistance component current or the resistance value that is the calculation result is stored at a predetermined interval in the memory units 9 and 24, and the stored value is read out as required. According to this embodiment, the past data can be referred and is used effectively for data analysis.

Next, the twenty-sixth embodiment will be described.

Figure 11:
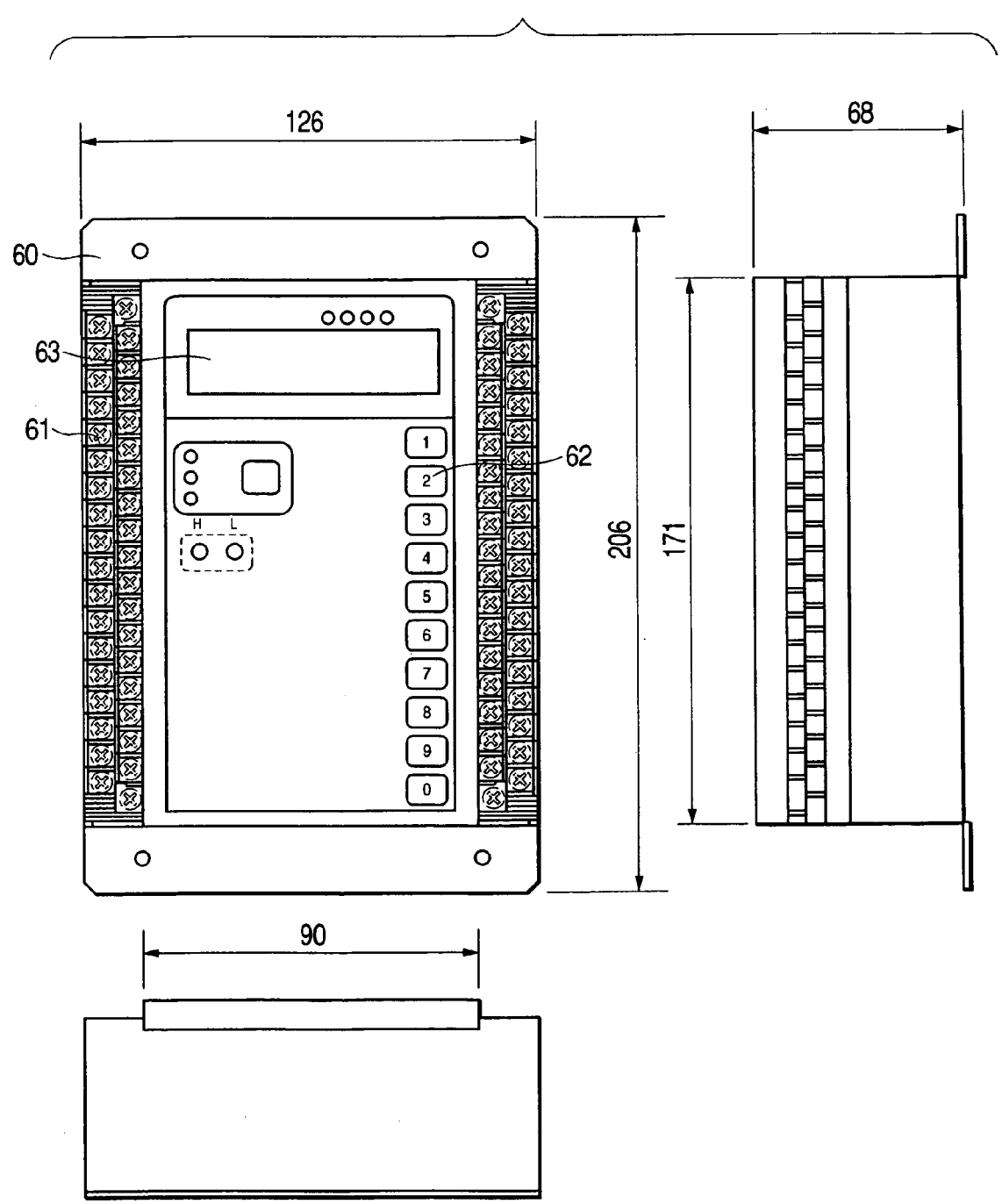
FIG. 11 is an apparent view of an insulation monitoring apparatus.

FIG. 11 is an apparent view of a monitoring apparatus, which is provided in a distribution panel as described herein under. In FIG. 11, 60 denotes a box for containing components, 61 denotes a terminal table for connecting a current signal line 3 and a voltage signal line 4 extending from a current transformer 20, 62 denotes a setting unit for setting the alarm level and the ratio of current transformation, for selecting a plurality of inputs, and for switching the display type, and 63 denotes a display unit for displaying the value at the setting, and for displaying the leakage current value and the resistance value that are obtained as the result of operation of an arithmetic processing unit.

Figure 12:
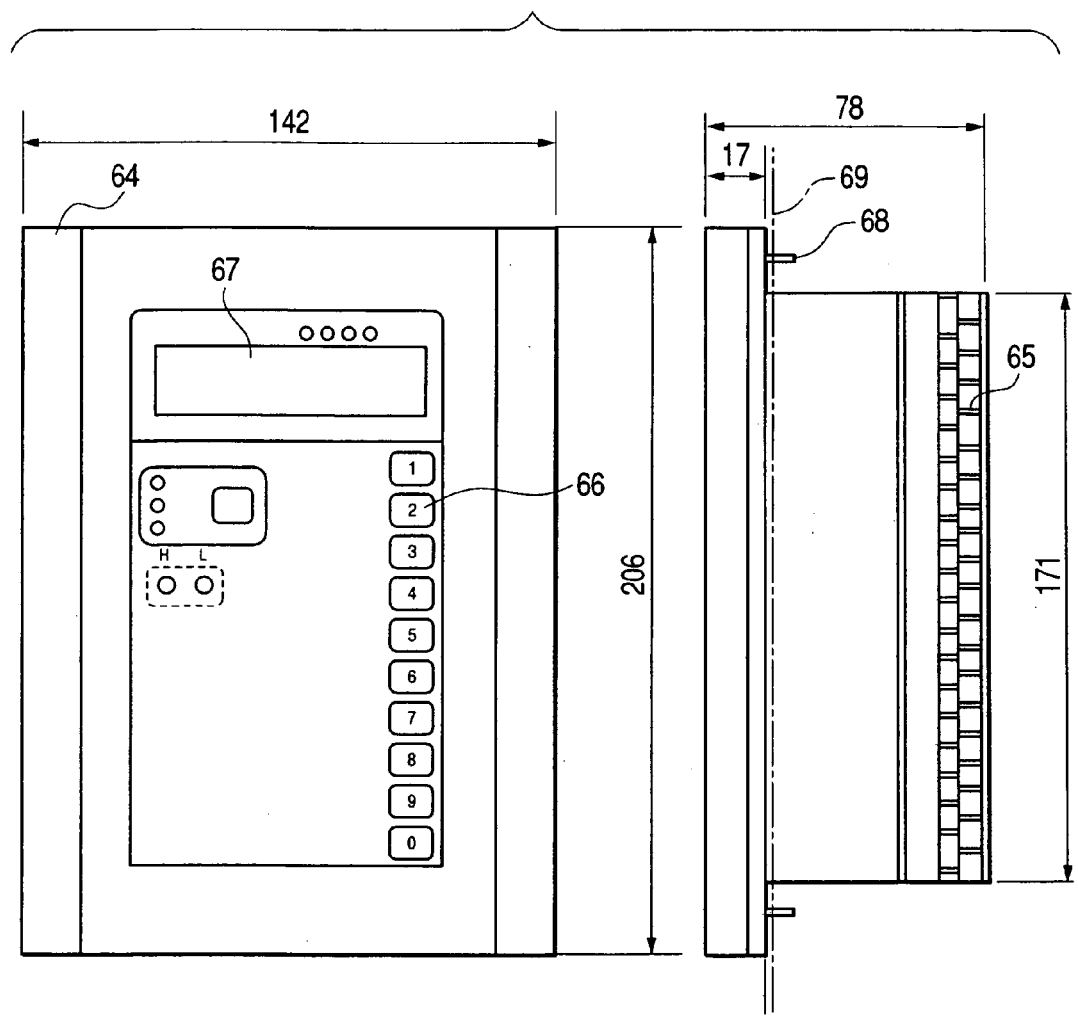
FIG. 12 is an apparent view of another exemplary insulation monitoring apparatus.
Figure 12:
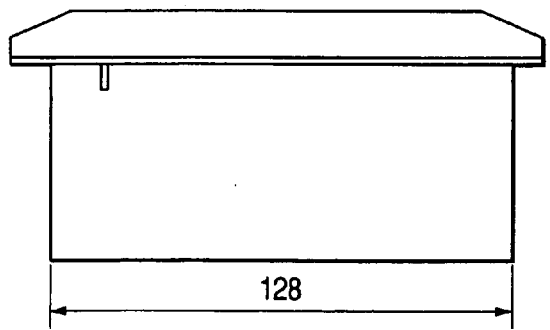

FIG. 12 is an apparent view of a monitoring apparatus, which is mounted on the panel surface of a distribution panel. In FIG. 12, 64 denotes a box for containing components, 65 denotes a terminal table for connecting a current signal line 3 and a voltage signal line 4 extending from a current transformer 20, 66 denotes a setting unit for setting the alarm level and the ratio of current transformation, for selecting a plurality of inputs, and for switching the display type, 67 denotes a display unit for displaying the value at the time of setting, and for displaying the leakage current value and the resistance value that are obtained as the result of operation of an arithmetic processing unit, and 68 denotes a bolt for fixing on the panel surface 69 of the distribution panel.

Figure 13A:
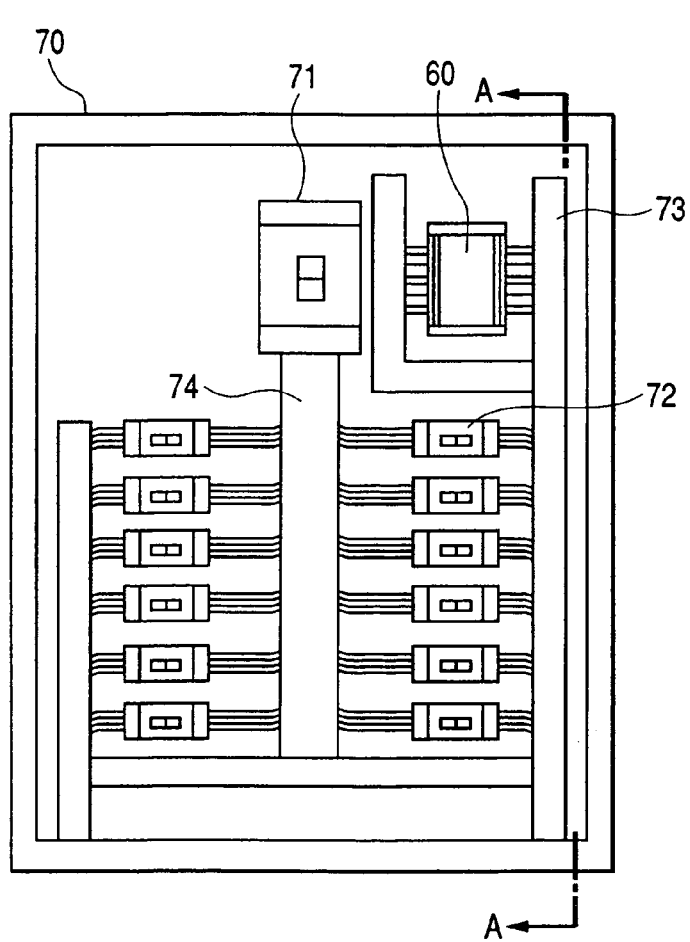
FIG. 13A is a front view of the insulation monitoring apparatus and FIG. 13B is a A—A cross sectional view of FIG. 13A.
Figure 13B:
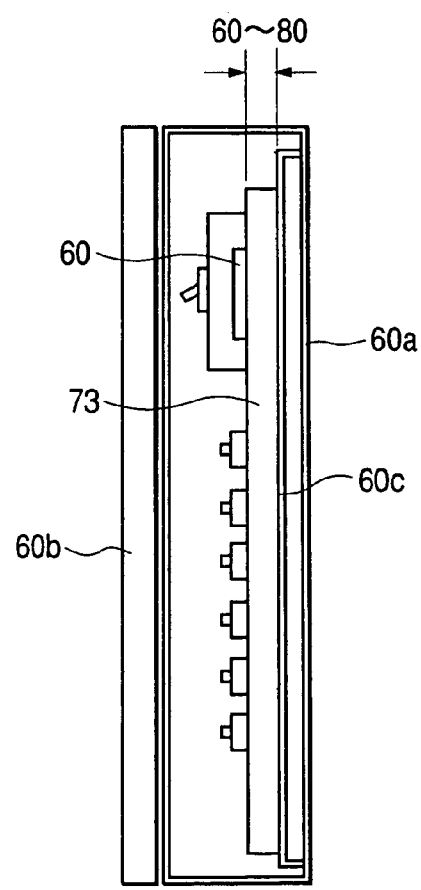

FIG. 13 is a view showing the monitoring apparatus contained in the distribution panel.

In FIG. 13, 70 denotes a distribution panel body, 60*a* denotes a case, 60*b* denotes a door, and 60*c* denotes a back plate. 71 denotes a main circuit breaker of the distribution circuit, 72 denotes a branching breaker of the distribution circuit, 73 denotes a duct for containing arranged wirings, 74 denotes a duct for containing arranged main circuit wirings of the distribution circuit, and 75 denotes a monitoring apparatus of the type contained in the distribution panel.

Herein the monitoring apparatus shown in FIG. 11 is an apparatus of the type that is contained in a distribution panel. The size of the box 60 is 206 mm×142 mm.

The monitoring apparatus shown in FIG. 12 is an apparatus of the type that is mounted on the panel face of a distribution panel. The size of the box is 206 mm×142 mm. Such monitoring apparatus as described hereinabove having one side of about 200 mm and the other side in a range from 100 mm to 200 is smaller than the conventional monitoring apparatus and the space for installing a monitoring apparatus is saved, and the monitoring apparatus can be contained in a distribution panel that is used generally.

The depth size of an monitoring apparatus, particularly the height of a terminal table, corresponds to the height of the above-mentioned duct 73. A duct having height of 60 mm popularly used as shown in the A-A cross sectional view of the distribution panel. Therefore, a terminal table having a height of about 60 mm to 80 mm brings about easy wiring, namely improved workability, and the appearance after wiring is improved.

Furthermore, the width and height of a monitoring apparatus relates to the outside dimension of a distribution panel, a monitoring apparatus having the outside dimension as shown in FIG. 11 can be contained in a free space of a distribution panel, and a distribution panel having a conventional dimension can be used.

As described hereinabove, according to the present invention, the resistance component current can be measured even if the electrostatic capacity of the load of a wiring circuit is large.

Furthermore, because it is not necessary to apply an external voltage, the load component is not affected adversely.

Furthermore, a monitoring apparatus has the simple structure, does not require an auxiliary impedance element, and can be applied to a plurality of distribution circuits.

Because it is possible to measure the reliable high resistance component current value and the resistance value and to specify the insulation deterioration phase, the monitoring apparatus is useful for check and maintenance and brings about prevention of failure by monitoring the change of insulation deterioration with time and by generating alarm when required.

What is claimed is:

1. A leakage current measurement method comprising the steps of:
   obtaining a leakage current signal of an AC target measurement circuit;
   obtaining a voltage signal of said target measurement circuit;
   sampling and storing the waveform of said leakage current signal and said voltage signal for one cycle;
   expanding said leakage current signal and said voltage signal to N-th higher harmonic wave component respectively; and
   calculating the resistance component that relates to the leakage current according to the simultaneous equations based on the assumption that the value obtained by dividing the leakage current component of the second or higher order by the voltage component of the same order is regarded to be equal to the admittance composed of the resistance component of the same order and the electrostatic capacity component.

2. A leakage current measurement method comprising the steps of:
   obtaining a leakage current signal of an AC target measurement circuit;
   obtaining a voltage signal of said target measurement circuit;
   sampling and storing the waveform of said leakage current signal and said voltage signal for one cycle;
   expanding said leakage current signal and said voltage signal to signal to N-th higher harmonic wave component respectively; and
   calculating the resistance component that relates to the leakage current from the phase angle difference between the leakage current component of at least one order obtained from the expansion arithmetic and the voltage component of the same order.

3. The leakage current Measurement method as claimed in 1 or 2, wherein the leakage current measurement method comprises a step for automatically selecting the order for calculation of the resistance component that relates to the leakage current from the largest proportion to the basic wave component of the N-th order higher harmonic wave component.

4. The leakage current measurement method as claimed in 1 or 2, wherein the order of the multiple of 3 is selected.

5. A leakage current measurement method comprising the steps of:
   obtaining a leakage current signal of an AC target measurement circuit;
   obtaining a voltage signal of said target measurement circuit;
   sampling and storing the waveform of said leakage current signal and said voltage signal for one cycle;
   expanding said leakage current signal and said voltage signal to the DC component and N-th higher harmonic wave component respectively; and
   calculating the resistance component that relates to the leakage current by dividing said voltage signal DC component obtained from the expansion arithmetic by said leakage current signal DC component obtained in the same manner.

6. A monitoring apparatus comprising:
   an input unit for receiving the output of a current transformer for detecting leakage current of a target measurement circuit;
   an A/D converter unit for converting the output of said input unit to a digital value;
   a memory unit for storing the value that has been converted by said A/D converter unit;
   an arithmetic processing unit for calculating said leakage current and for conducting the arithmetic processing; and
   an output unit for supplying the arithmetic result of said arithmetic processing unit,
   wherein said arithmetic processing unit includes:
   a means for obtaining a leakage current signal of an AC target measurement circuit;
   a means for obtaining a voltage signal of said target measurement circuit;
   a means for sampling and storing the waveform of said leakage current signal and said voltage signal for one cycle;
   a means for expanding said leakage current signal and said voltage signal to N-th higher harmonic wave component respectively; and
   a means for calculating the resistance component that relates to said leakage current according to the simultaneous equations based on the assumption that the value obtained by dividing said leakage current component of the second or higher order by the voltage component of the same order is regarded to be equal to the admittance composed of the resistance component of the same order and the electrostatic capacity component.

7. A monitoring apparatus comprising:
an input unit for receiving the output of a current transformer for detecting leakage current of a target measurement circuit;
an A/D converter unit for converting the output of said input unit to a digital value;
a memory unit for storing the value that has been converted by said A/D converter unit;
an arithmetic processing unit for calculating said leakage current and for conducting the arithmetic processing; and
an output unit for supplying the arithmetic result of said arithmetic processing unit,
wherein said arithmetic processing unit includes:
a means for obtaining a leakage current signal of an AC target measurement circuit;
a means for obtaining a voltage signal of said target measurement circuit;
a means for sampling and storing the waveform of said leakage current signal and said voltage signal for one cycle;
a means for expanding said leakage current signal and said voltage signal to N-th higher harmonic wave component respectively; and
a means for calculating the resistance component that relates to said leakage current from the phase angle difference between said leakage current component of at least one order obtained from the expansion arithmetic and the voltage component of the same order.

8. A monitoring apparatus comprising:
an input unit for receiving the output of a current transformer for detecting leakage current of a target measurement circuit;
an A/D converter unit for converting the output of said input unit to a digital value;
a memory unit for storing the value that has been converted by said A/D converter unit;
an arithmetic processing unit for calculating said leakage current and for conducting the arithmetic processing; and
an output unit for supplying the arithmetic result of said arithmetic processing unit,
wherein said arithmetic processing unit includes:
a means for obtaining a leakage current signal of an AC target measurement circuit;
a means for obtaining a voltage signal of said target measurement circuit;
a means for sampling and storing the waveform of said leakage current signal and said voltage signal for one cycle;
a means for expanding said leakage current signal and said voltage signal to the DC component and N-th higher harmonic wave component respectively; and
a means for calculating the resistance component that relates to said leakage current by dividing said voltage signal DC component obtained from the expansion arithmetic by said leakage current signal DC component obtained in the same manner.

9. A monitoring system for monitoring leakage current comprising:
a monitoring apparatus including:
an input unit for receiving the output of a current transformer for detecting said leakage current of a target measurement circuit;
an A/D converter unit for converting the output of said input unit to a digital value;
a memory unit for storing the value that has been converted by said A/D converter unit;
an arithmetic processing unit for calculating and operating said leakage current having a means for obtaining a leakage current signal of an AC target measurement circuit, a means for obtaining a voltage signal of said target measurement circuit, a means for sampling and storing the waveform of said leakage current signal and said voltage signal for one cycle, a means for expanding said leakage current signal and said voltage signal to N-th higher harmonic wave component respectively, and a means for calculating the resistance component that relates to said leakage current according to the simultaneous equations based on the assumption that the value obtained by dividing said leakage current component of the second or higher order by the voltage component of the same order is regarded to be equal to the admittance composed of the resistance component of the same order and the electrostatic capacity component; and
an output unit for supplying the arithmetic result of said arithmetic processing unit, and
a host apparatus for storing and displaying the information obtained from said monitoring apparatus.

10. A monitoring system for monitoring leakage current comprising:
a monitoring apparatus including:
an input unit for receiving the output of a current transformer for detecting said leakage current of a target measurement circuit;
an A/D converter unit for converting the output of said input unit to a digital value;
a memory unit for storing the value that has been converted by said A/D converter unit;
an arithmetic processing unit for calculating and operating said leakage current having a means for obtaining a leakage current signal of an AC target measurement circuit, a means for obtaining a voltage signal of said target measurement circuit, a means for sampling and storing the waveform of said leakage current signal and said voltage signal for one cycle, a means for expanding said leakage current signal and said voltage signal to N-th higher harmonic wave component respectively, and a means for calculating the resistance component that relates to said leakage current from the phase angle difference between said leakage current component of at least one order obtained from the expansion arithmetic and the voltage component of the same order; and
an output unit for supplying the arithmetic result of said arithmetic processing unit, and
a host apparatus for storing and displaying the information obtained from said monitoring apparatus.

11. A monitoring system for monitoring leakage current comprising:
a monitoring apparatus including:
an input unit for receiving the output of a current transformer for detecting said leakage current of a target measurement circuit;
an A/D converter unit for converting the output of said input unit to a digital value;
a memory unit for storing the value that has been converted by said A/D converter unit;

an arithmetic processing unit for calculating and operating said leakage current having a means for obtaining a leakage current signal of an AC target measurement circuit, a means for obtaining a voltage signal of said target measurement circuit, a means for sampling and storing the waveform of said leakage current signal and said voltage signal and said voltage signal to the DC component and N-th higher harmonic wave component respectively, and a means for calculating the resistance component that relates to said leakage current by dividing said voltage signal DC component obtained from the expansion arithmetic by said leakage current signal DC component obtained in the same manner; and an output unit for supplying the arithmetic result of said arithmetic processing unit, and a host apparatus for storing and displaying the information obtained from said monitoring apparatus.

* * * * *